United States Patent
Behrends et al.

(10) Patent No.: US 8,520,429 B2
(45) Date of Patent: Aug. 27, 2013

(54) DATA DEPENDENT SRAM WRITE ASSIST

(75) Inventors: Derick G. Behrends, Rochester, MN (US); Todd A. Christensen, Rochester, MN (US); Travis R. Hebig, Rochester, MN (US); Michael Launsbach, Rochester, MN (US); Daniel M. Nelson, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 189 days.

(21) Appl. No.: 13/101,436

(22) Filed: May 5, 2011

(65) Prior Publication Data

US 2012/0281457 A1 Nov. 8, 2012

(51) Int. Cl.
*G11C 11/00* (2006.01)
*G11C 5/14* (2006.01)

(52) U.S. Cl.
USPC ............................. 365/154; 365/156; 365/226

(58) Field of Classification Search
USPC .......................................... 365/154, 156, 226
See application file for complete search history.

(56) References Cited

U.S. PATENT DOCUMENTS

| | | | |
|---|---|---|---|
| 5,303,190 A | 4/1994 | Pelley, III | |
| 5,939,762 A | 8/1999 | Lien | |
| 6,584,030 B2 | 6/2003 | Marr | |
| 7,324,368 B2 * | 1/2008 | Wang et al. | 365/154 |
| 7,643,357 B2 | 1/2010 | Braceras et al. | |
| 7,817,481 B2 * | 10/2010 | Adams et al. | 365/154 |
| 7,817,490 B1 | 10/2010 | Sridhara | |
| 7,835,217 B1 | 11/2010 | Su et al. | |
| 7,852,661 B2 | 12/2010 | Liu | |
| 7,864,617 B2 * | 1/2011 | Kenkare | 365/226 |
| 7,885,124 B2 | 2/2011 | Koike et al. | |
| 8,045,402 B2 * | 10/2011 | Yeung | 365/154 |
| 8,218,390 B2 * | 7/2012 | Nii et al. | 365/154 |
| 8,320,164 B2 * | 11/2012 | Chuang et al. | 365/154 |
| 2003/0043677 A1 | 3/2003 | Marr | |
| 2009/0207650 A1 | 8/2009 | Braceras et al. | |

OTHER PUBLICATIONS

Technical Disclosure, IPCOM000159723D, dated Oct. 26, 2007, entitled, "Stable SRAM Cell Topologies".

* cited by examiner

*Primary Examiner* — Trong Phan
(74) *Attorney, Agent, or Firm* — Robert R. Williams

(57) ABSTRACT

A semiconductor chip has an SRAM (static random access memory). The SRAM includes a data dependent write assist circuit which, on writes, reduces a supply voltage on one of a cross coupled inverter pair in an SRAM cell, thereby making it easier to overcome the one of the cross coupled inverters.

2 Claims, 5 Drawing Sheets

DATA DEPENDENT SRAM WRITE ASSIST

FIELD OF THE INVENTION

This invention relates generally to semiconductor chips, and more specifically to an SRAM (Static Random Access Memory) having a data dependent write assist feature.

SUMMARY OF EMBODIMENTS OF THE INVENTION

A semiconductor chip comprises an SRAM (static random access memory) having a data dependent write assist to provide increased write performance.

During write of an SRAM cell, true and complement bit lines are driven to "1" and "0" (or "0" and "1") depending on a logical value to be written to the SRAM cell. A word line turns on pass gates, and the logical value driven on the true and complement bits lines are written through the pass gates into a data retention circuit comprising cross coupled inverters in the SRAM cell. During a write, a circuit driving a bit line low ("0") must compete, for a while, with an inverter of the cross coupled inverters driving "1" until overcome, assuming that data in the SRAM cell is being changed.

In an embodiment of the invention, a voltage supply of a first inverter is reduced if a "0" is going to be driven onto a first bit line (e.g., the true bit line) that is connected, through a pass gate, to an output of the first inverter. Drive capability of the first inverter is reduced by the reduced voltage supply, making it faster for the circuit driving the first bit line to write data into the SRAM cell. Similarly, if a second bit line (e.g., the complement bit line) is driven low ("0"), a voltage supply of a second inverter is reduced, thereby making the second inverter easier to overcome.

DETAILED DESCRIPTION OF THE EMBODIMENTS

In the following detailed description of embodiments of the invention, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

Embodiments of the present invention provide a data dependent SRAM (static random access memory) write assist in an SRAM on a semiconductor chip. The data dependent SRAM write assist provides for improved (faster) write times when data is being written to the SRAM.

Figure 1:
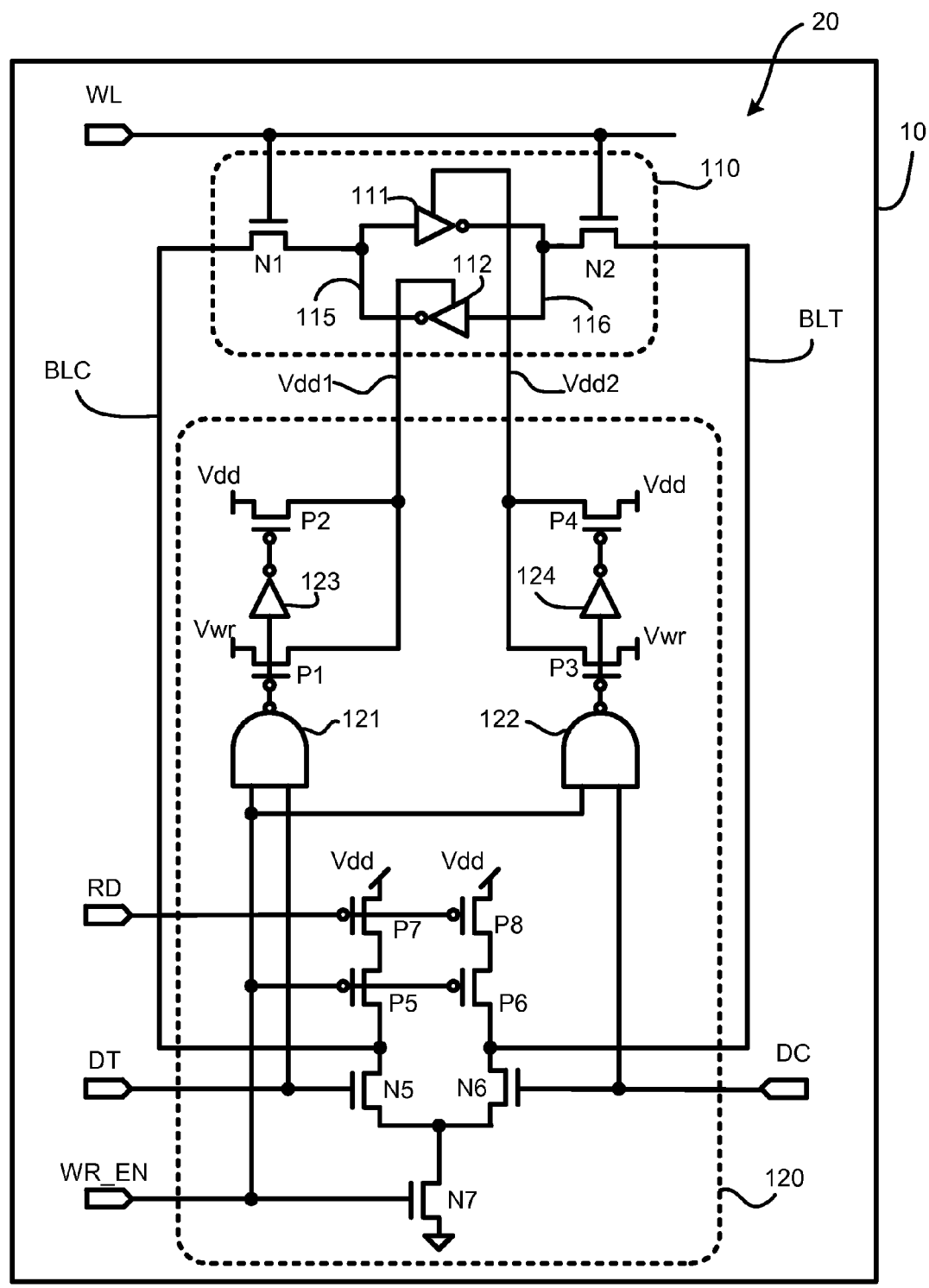
FIG. 1 shows a schematic of a chip having an SRAM with a data dependent SRAM write assist.

With reference now to FIG. 1, a semiconductor chip 10 comprises an SRAM 20. In the schematic and description thereof, all FETs beginning with "N" (e.g., N1) are N-channel Field Effect Transistors (NFETs); all FETs beginning with "P" (e.g., P1) are P-channel Field Effect Transistors (PFETs).

SRAM 20 comprises one or more SRAM cells 110. SRAM cell 110 further comprises cross coupled inverters 111 and 112 to store a bit of data. N1 and N2 are coupled to a word line WL. When WL is activated, N1 and N2 turn on and couple bit lines BLT (bit line true) and BLC (bit line complement) to the cross coupled inverters 111 and 112. Inverter 111 drives node 116; inverter 112 drives node 115. During a write, BLT and BLC are driven to "0" and "1" (or "1" and "0", depending on a logical value to be written into SRAM cell 110).

Typically in an SRAM 20, WL is connected to a number (e.g., 32, 64, 128, and so on) of SRAM cells 110, although only a single SRAM cell 110 is shown for simplicity. Likewise, bit lines BLT and BLC are typically connected to a number (e.g., 32, 64, 128, and so on) of SRAM cells 110; again, only a single SRAM cell 110 is shown for simplicity. Vdd1 and Vdd2 are connected to each SRAM cell 110 that BLT and BLC are connected to.

Data dependent write assist circuit 120 drives BLT and BLC when WR_EN (write enable) is active ("1").

When DT (data true) is "1", DC (data complement) is "0". DT will turn on N5; DC, being "0", will have N6 turned off. BLC will be pulled low "0" through N5 and N7. N1, activated by WL being "1", will need to overcome current driven from inverter 112, assuming that inverter 112 is driving a "1" (that is, a bit stored in SRAM cell 110 is being changed). BLC will need to pull node 115 low enough to cause inverter 111 to drive a "1" instead of a "0". If inverter 112 were already driving a "0" data stored in SRAM cell 110 is not being changed. Similarly, if DT is "0", DC will be "1"; BLT will be driven to "0" through N6 and N7, and an output of inverter 111 must be overcome (assuming data in SRAM cell 110 is being changed) to write the "0" in SRAM cell 110.

P5, P6, P7, and P8 in data dependent write assist circuit 120 drive BLT and BLC to Vdd when WR_EN is "0" and RD (read) is "0", thereby precharging BLT and BLC to Vdd. When WR_EN is "0" (not writing data) and RD is "1" (read data), BLT and BLC are driven only by cross coupled inverters 111 and 112 through N1 and N2, and a sense amplifier coupled to BLT and BLC determines whether a logical "1" or a logical "0" is stored in SRAM cell 110.

Data dependent write assist circuit 120, during a write (WR_EN="1") drives either Vdd or Vwr on Vdd1, and, at the same time, drives Vwr or Vdd onto Vdd2, depending upon whether data to be written to SRAM cell 110 is a "1" or a "0". Vwr is a lower voltage than Vdd. Vwr will be supplied to either inverter 112 or inverter 111 depending on DT and DC.

Assume that DT="1" (and, therefore, DC="0") during a write. NAND 121 will receive a "1" from WR_EN and a "1" from DT; NAND 121 will respond by driving a "0" to P1 thereby connecting Vwr to Vdd1. Inverter 123 will output a "1" to P2, isolating Vdd from Vdd1. Inverter 112 will therefore have a reduced voltage supply and will, therefore, be easier to pull down through N1, N5 and N7.

Similarly, when DT="0" (and, therefore, DC="1") during a write, NAND 122 will drive a "0", turning on P3 and, through inverter 124, turn off P4, thereby driving Vwr instead of Vdd onto Vdd2 and making inverter 111 easier to overcome through N2, N6 and N7.

Figure 5:
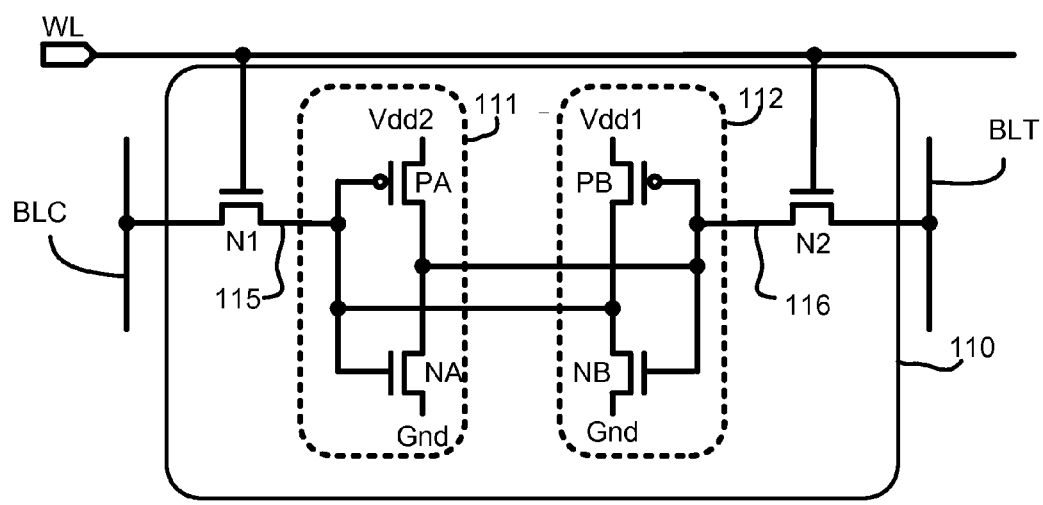
FIG. 5 shows additional detail of an SRAM cell.

FIG. 5 shows SRAM cell 110 in more detail. Inverter 111 further comprises PFET PA and NFET NA. A source of PA is connected to Vdd2 and a source of NA is connected to Gnd. Drains of PA and NA are connected together at node 116 (see also FIG. 1). Inverter 112 comprises PFET PB and NFET NB.

PB comprises a source connected to Vdd1; NB comprises a sourced connected to Gnd. Drains of PB and NB are connected together at node 115.

For exemplary purposes, SRAM cell 110 is shown having NFET pass gates (N1, N2). This is a conventional SRAM cell using current technologies. It is contemplated that an SRAM cell may also be made having PFET pass gates. In such an embodiment, to write data into cross coupled inverters 111, 112, a bit line (BLT, BLC) would have to overcome an output of 111, or 112 by pulling upwards, through a PFET pass gate, rather than pulling an output of 111 or 112 down. In general, "overcoming" an inverter is needed to change data stored in the cross coupled inverters. It will also be understood that, in the variant embodiment using PFET pass gates, reducing a supply voltage to make inverter 111 or 112 easier to overcome may also be implemented by raising a "ground" voltage supply to the inverter which is to be overcome, versus reducing a Vdd supply (such as Vwr instead of Vdd) to that inverter.

Figure 2:
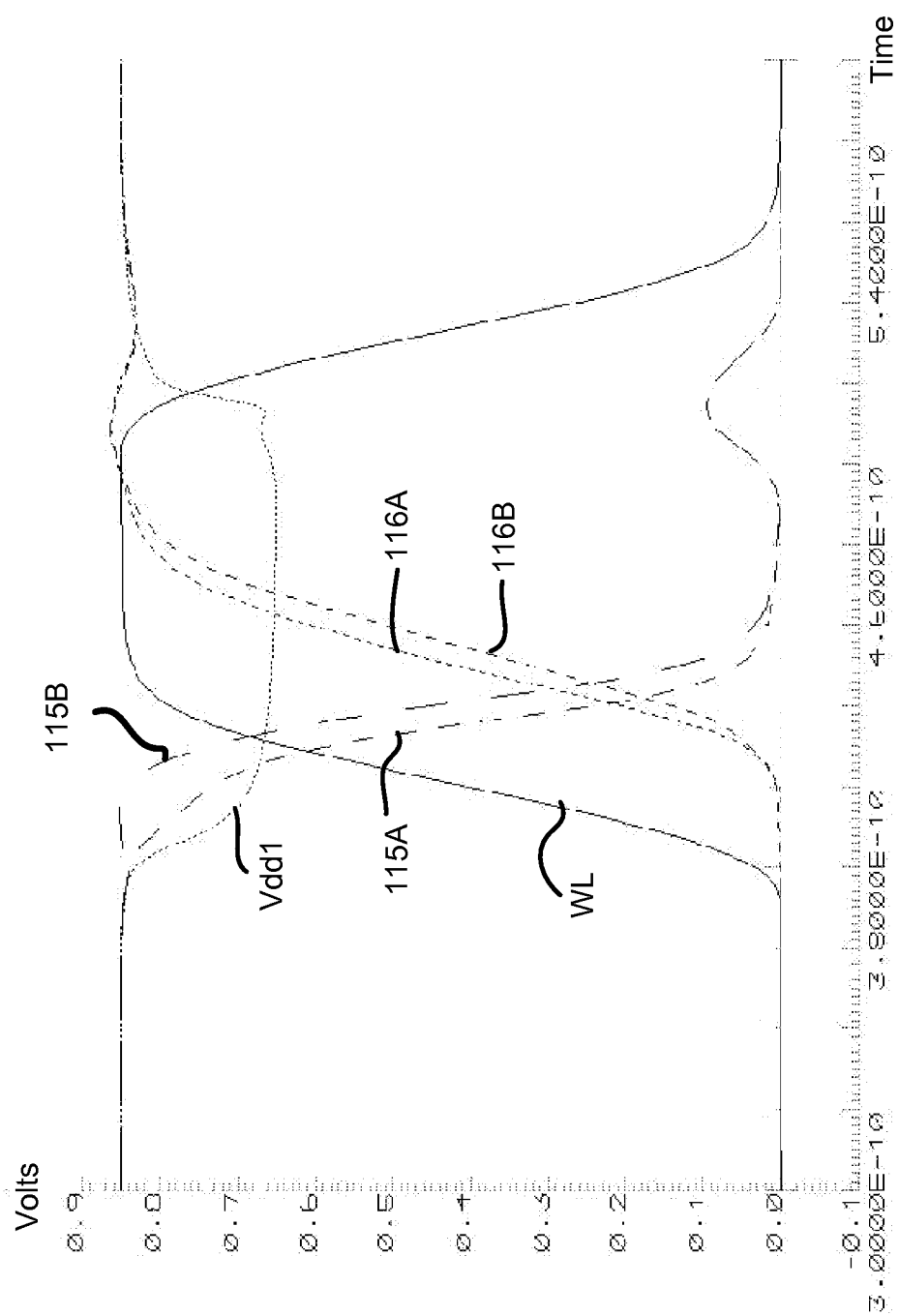
FIG. 2 shows a simulation under nominal conditions of an SRAM write for an SRAM with a data dependent write assist circuit and for an SRAM write for an SRAM without a data dependent write assist circuit.

Turning now to FIG. 2, a simulation showing comparative performance of writing an SRAM cell with and without benefit of data dependent write assist circuit 120 is shown. Nominal Vdd (0.85 volts) and nominal process conditions are used in the simulation of FIG. 2. A write operation begins with a rise of WL. Vdd1 is shown to fall from 0.85 volts to approximately 0.65 volts in a case having benefit of data dependent write assist. In a case simulated without benefit of data dependent write assist circuit 120, both cross coupled inverters in the SRAM cell use Vdd (i.e., Vwr=Vdd) as a supply voltage. Nodes 115, 116 (FIG. 1) in the case without benefit of data dependent write assist are identified with a suffix "B" (e.g., nodes 115B, 116B). In the case simulated with benefit of data dependent write assist circuit 120 (Vwr=approximately 0.65 volts), nodes 115, 116 (FIG. 1) are identified with a suffix "A" (nodes 115A, 116A). Vdd1 returns to Vdd when WL falls, as both NAND 121 and NAND 122 output "1", which causes inverters 123 and 124 to output "0", turning on P2 and P4. Even at the nominal conditions used in the simulations of FIG. 2, a significant write performance is achieved through use of data dependent write assist circuit 120.

P1, P2, P3, and P4 (FIG. 1) must be designed large enough to bring Vdd1 and Vdd2 to Vwr and back to Vdd quickly enough (see simulation results of FIG. 2) to be effective in improving performance. Vdd1 and Vdd2 will supply voltage to inverters 111 and 112 for a number of SRAM cells 110 in typical SRAMs 20, and will, therefore, have significant capacitance that must be partially discharged and re-charged by P1, P2, P3, and P4.

Figure 3:
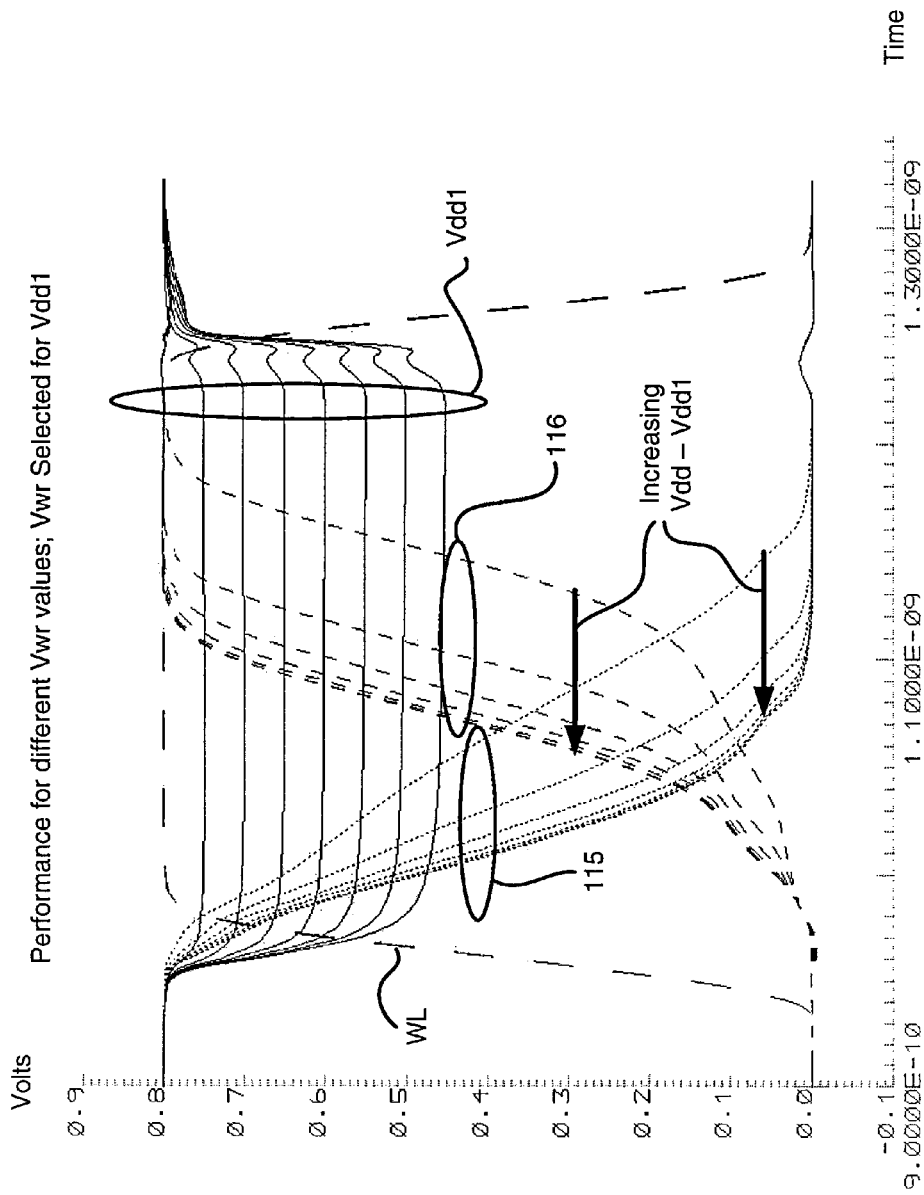
FIG. 3 shows a series of simulations used to determine how much to reduce a voltage supply on a cross coupled inverter in an SRAM cell for a desired power/performance tradeoff.

FIG. 3 shows a series of simulations using data dependent write assist circuit 120, where Vwr is varied to determine an optimal value for Vwr. What is actually plotted is Vdd1 when Vwr is selected for Vdd1, using NAND 121 and P1 shown in FIG. 1. The simulations of FIG. 3 assume a worst case set of parameters in environmental and process conditions, such as high thresholds on N1 and N2, a low value of Vdd (0.8 volts), for examples. Each simulation run changes Vwr (Vdd1) by 0.050 volts. Slowest responses to a rising WL occur when Vdd-Vdd1 is 0.050 volts, that is, the least simulated amount of reduction of Vdd1 from Vdd. As Vdd-Vdd1 is increased, write performance improves (gets faster), but does not improve significantly beyond a Vdd-Vdd1 of about 150 mV (millivolts). Since power is consumed to lower Vdd1 and bring Vdd1 back to Vdd at the end of a write cycle, a value of about 150 mV for Vdd-Vdd1, for the design simulated, is a reasonable tradeoff between power and increased write performance. Optimal value for Vdd-Vdd1 will vary depending on technology. For example, an SRAM in an older technology using a Vdd of 1.5 volts may have an optimal value of Vdd-Vdd1 greater than 150 mV). In addition, when low power consumption is a bigger concern than performance, a designer may choose a smaller value of Vdd-Vdd1; for example, as seen in FIG. 3, much of the benefit of data dependent write assist circuit 120 comes from a 100 mV value for Vdd-Vdd1 (note that Vdd-Vdd1=0.0 was not simulated in FIG. 3).

Figure 4:
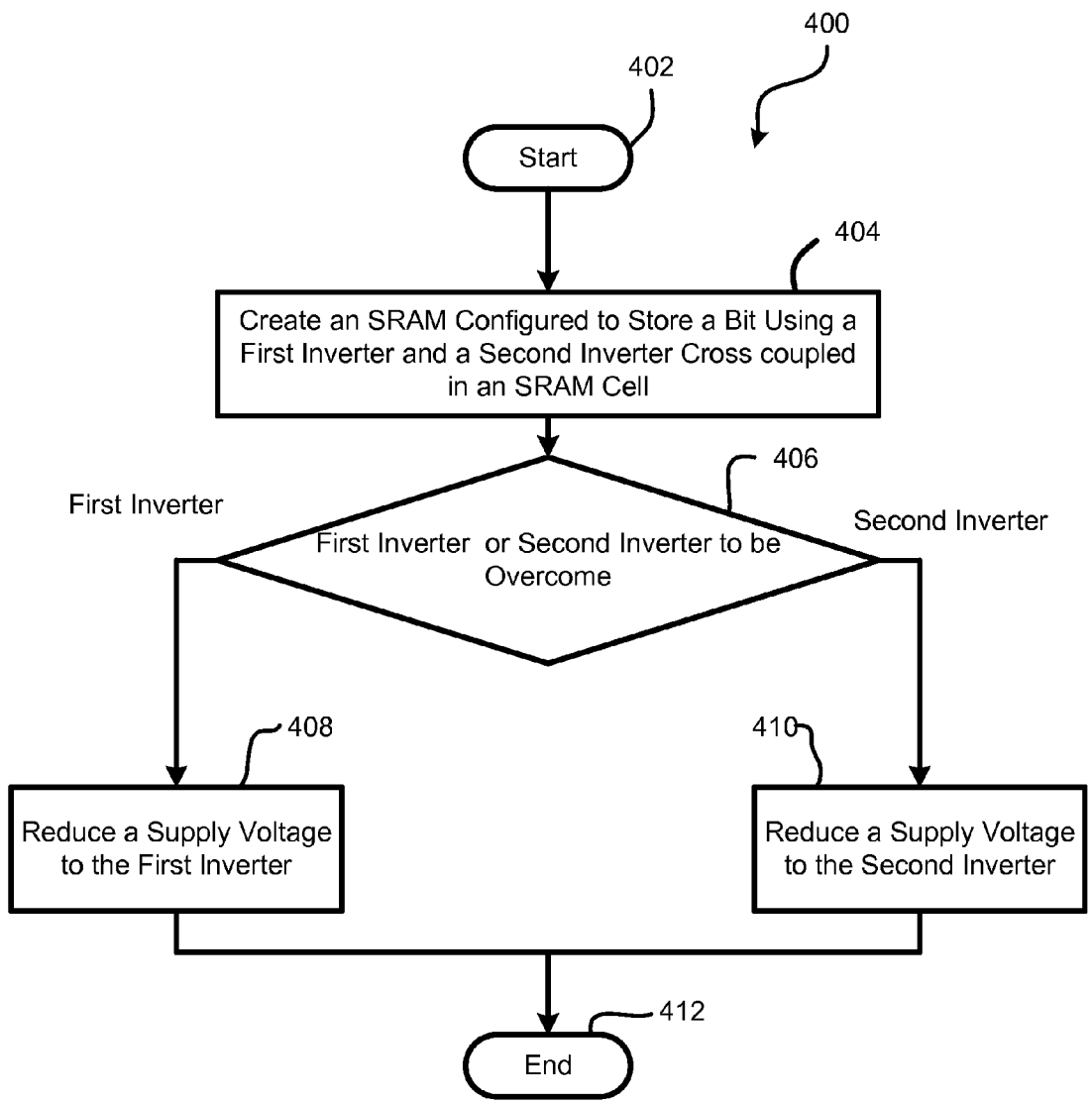
FIG. 4 is a flow chart of a method embodiment of the invention.

Embodiments of the invention may be expressed as methods. FIG. 4 is a flowchart of a method 400 to improve performance of an SRAM, such as SRAM 20 of FIG. 1. Method 400 begins at 402.

In block 404, an SRAM is created, comprising, for each bit to be stored in the SRAM, a first inverter (such as inverter 111 in FIG. 1) and a second inverter (such as inverter 112 in FIG. 1) are cross coupled to retain a bit of data. Pass gate transistors may be used as shown in FIG. 1 to gate data from a bit line true (BLT, FIG. 1) and a bit line complement (BLC, FIG. 1) to the cross coupled inverters.

In block 406, circuitry determines, during a write, whether the first inverter or the second inverter must be overcome to write data into the cross coupled inverters. If it is determined that the first inverter must be overcome, in block 408 a supply voltage connected to the first inverter is reduced, making the first inverter easier to overcome. If it is determined in block 406 that the second inverter is to be overcome, then in block 410 a supply voltage connected to the second inverter is reduced, making the second inverter easier to overcome.

Block 412 ends method 400.

What is claimed is:

1. A semiconductor chip comprising:
an SRAM (static random access memory), the SRAM further comprising:
an SRAM cell comprising a first inverter and a second inverter, an output of the first inverter connected to an input of the second inverter, an output of the second inverter connected to an input of the first inverter; and
a data dependent write assist circuit configured to reduce a supply voltage to the first inverter if the first inverter must be overcome during a write, and to reduce a supply voltage of the second inverter if the second inverter must be overcome during a write; and
the data dependent write assist circuit further comprising logic to couple a Vdd supply to the first inverter when a write enable is low or when a data true signal is low, and to couple a Vwr supply that is lower than the Vdd supply, to the first inverter when both the write enable and the data true signal are high.

2. The semiconductor chip of claim 1, the data dependent write assist circuit further comprising logic to couple the Vdd supply to the second inverter when a write enable is low or when a data complement signal is low, and to couple the Vwr supply to the second inverter when both the write enable and the data complement signal are high.

* * * * *